United States Patent
Bang

(10) Patent No.: US 8,379,462 B2
(45) Date of Patent: Feb. 19, 2013

(54) MEMORY DEVICE HAVING REDUCED STANDBY CURRENT AND MEMORY SYSTEM INCLUDING SAME

(75) Inventor: Jong-Min Bang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 346 days.

(21) Appl. No.: 12/780,974

(22) Filed: May 17, 2010

(65) Prior Publication Data

US 2010/0302877 A1     Dec. 2, 2010

(30) Foreign Application Priority Data

May 29, 2009    (KR) .................. 10-2009-0047602

(51) Int. Cl.
*G11C 7/00*            (2006.01)
(52) U.S. Cl. ............... 365/189.07; 365/229; 365/230.03
(58) Field of Classification Search .................. 365/226, 365/227, 229, 189.07, 205, 207
See application file for complete search history.

(56) References Cited

U.S. PATENT DOCUMENTS

| | | | |
|---|---|---|---|
| 6,079,023 A * | 6/2000 | Yoon et al. .................... 713/300 |
| 6,195,306 B1 | 2/2001 | Horiguchi et al. |
| 6,928,006 B2 | 8/2005 | Park |
| 7,120,070 B2 * | 10/2006 | Versen et al. ................ 365/201 |
| 7,123,536 B2 * | 10/2006 | Kang ............................ 365/226 |
| 7,366,023 B2 | 4/2008 | Ju |

FOREIGN PATENT DOCUMENTS

| | | |
|---|---|---|
| JP | 2007280606 A | 10/2007 |
| KR | 1020040044420 A | 5/2004 |
| KR | 1020040093894 A | 11/2004 |
| KR | 100672104 B1 | 1/2007 |

* cited by examiner

*Primary Examiner* — Gene Auduong
(74) *Attorney, Agent, or Firm* — Volentine & Whitt, PLLC

(57) ABSTRACT

A memory device includes a plurality of banks, a first generator generating standby current in response to a standby signal, and a switching circuit supplying the standby current to at least one of the plurality of banks in response to a plurality of active signals.

11 Claims, 5 Drawing Sheets

MEMORY DEVICE HAVING REDUCED STANDBY CURRENT AND MEMORY SYSTEM INCLUDING SAME

CROSS-REFERENCE TO RELATED APPLICATIONS

This application claims priority under 35 U.S.C. §119 to Korean Patent Application No. 10-2009-0047602 filed on May 29, 2009, the subject matter of which is hereby incorporated by reference.

BACKGROUND

The inventive concept relates to memory devices and memory systems. More particularly, the inventive concept relates to memory devices capable of reducing standby current consumption and memory systems incorporating same.

As integration density increases, the amount of power used by contemporary memory devices also increases. In particular, certain internal voltages applied the constituent memory cell array of a memory device in order to perform read/write operations consume an increasingly amount of power. As commonly constituted, memory cell arrays include a plurality of banks, each including an arrangement of memory cells. The applied internal voltages (individually or collectively hereafter termed, "array internal voltage") include not only refresh voltages used to maintain stored charge in volatile memory devices, but also other power supply voltages, such as a bias voltage.

In conventional memory device, the array internal voltage is supplied to each bank via a power line, and a voltage generator is typically provided for each bank. The voltage generator provides either an active current that activates the bank, or a standby current when the bank is operating in a standby mode.

As the number of banks in contemporary memory devices increases, the number of corresponding voltage generators also increases. Accordingly, the overall layout area of the memory device increases, as does the amount of current consumed.

SUMMARY

Embodiments of the inventive concept provide a memory device capable of reducing power (or current) consumption during a standby mode of operation. Embodiments of the inventive concept also provide memory systems including such memory devices.

According to an aspect of the inventive concept, there is provided a memory device comprising; a plurality of banks, a single first generator configured to generate a standby current in response to a standby signal, and a switching circuit configured to provide the standby current to a bank in the plurality of banks in response to a corresponding active signal.

According to another aspect of the inventive concept, there is provided a memory device comprising; a plurality of banks, a single first generator configured to generate standby current in response to a standby signal, a plurality of second generators, each configured to provide an active current to a corresponding one of the plurality of banks in response to a corresponding one of a plurality of active signals, and a plurality of switches, each being commonly connected between the first generator and each one of the plurality of banks and configured to provide the active current to a corresponding one of the plurality of banks in response to a corresponding one of the plurality of active signals.

According to another aspect of the inventive concept, there is provided a memory system comprising; a central processing unit (CPU) configured to provide a control signal, and a memory device configured to operate in response to the control signal. The memory device comprises; a plurality of banks, a single first generator configured to generate a standby current in response to a standby signal, and a switching circuit configured to provide the standby current to a bank in the plurality of banks in response to a corresponding active signal.

According to another aspect of the inventive concept, there is provided a method of providing standby current in a memory device comprising a plurality of banks, a single first generator configured to generate standby current, and a switching circuit comprising a plurality of switches interposed between the first generator and the plurality of banks, the method comprising; receiving an externally provided standby signal in the first generator and generating the standby current in response to the standby signal, receiving a plurality of active signals, each active signal being respectively applied to one of the plurality of bank, and providing the standby current through one of the plurality of switches circuit to a bank in the plurality of banks in response to a corresponding one of the plurality of active signals.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

The attached drawings illustrate certain embodiments of the inventive concept and may be referred to in order to gain a sufficient understanding of the inventive concept and the merits thereof. Hereinafter, the inventive concept will be described in some additional detail with reference to the drawings. Throughput the written description and drawings, like reference numbers and labels denote like or similar elements.

The illustrated embodiments are drawn to an example of a dynamic random access memory (DRAM). However, the scope of the inventive concept is not limited to only DRAMs. For example, other embodiments of the inventive concept may be applied to other types of volatile memory including the static random access memory (SRAM), the synchronous DRAM (SDRAM), the Rambus DRAM (RDRAM), etc.

Figure 1:
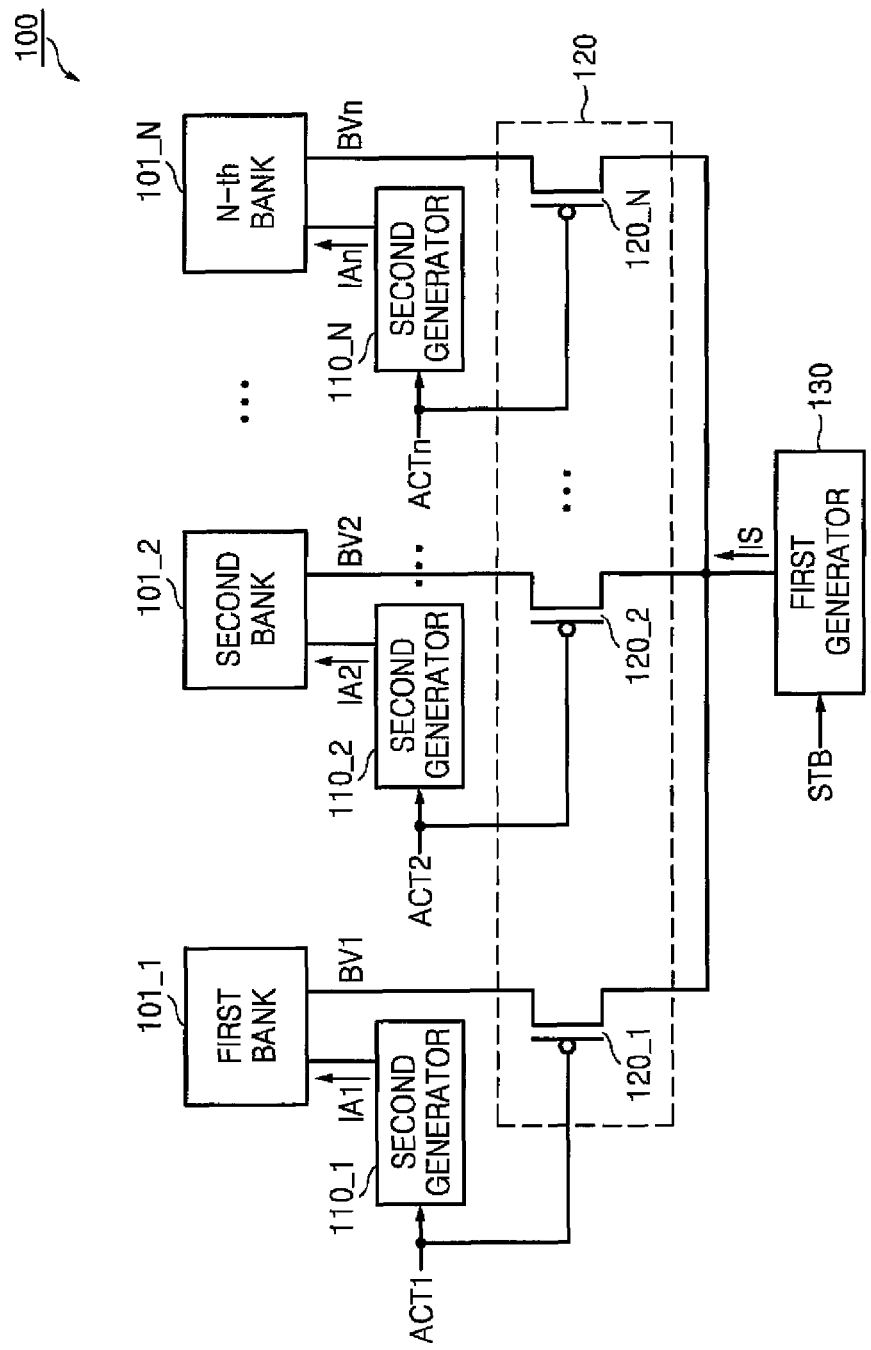
FIG. 1 is a schematic block diagram of a memory device according to an embodiment of the inventive concept.
Figure 2:
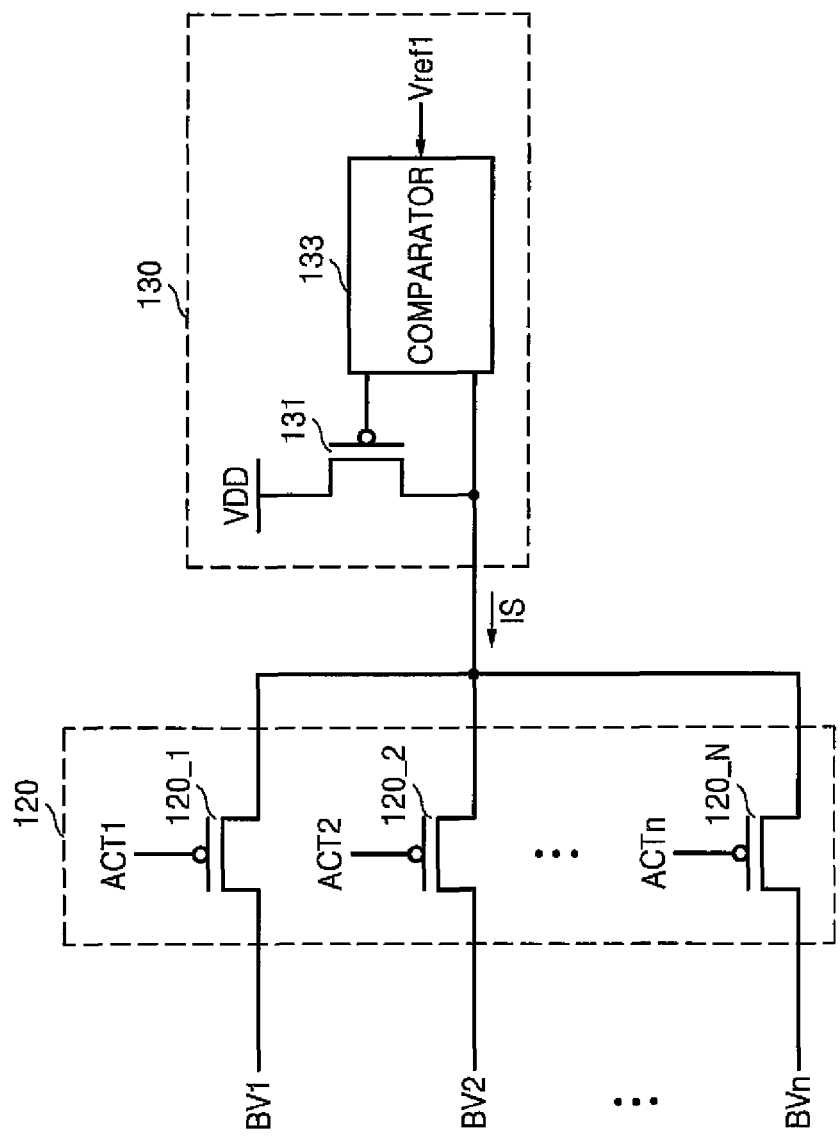
FIG. 2 is a schematic circuit diagram further illustrating the first generator of FIG. 1.

Figure (FIG. 1 is a schematic block diagram of a memory device 100 according to an embodiment of the inventive concept. FIG. 2 is a schematic circuit diagram further illustrating the first generator of FIG. 1. Referring to FIG. 1, the memory device 100 comprises a plurality of banks 101_1, 101_2, . . . , 101_N, a plurality of second generators 110_1, 110_2, . . . , 110_N, a switching circuit 120, and a first generator 130.

Each of the banks 101_1, 101_2, . . . , 101_N include a plurality of memory cells (not shown). Each of the memory cells is connected between a corresponding word line (not shown) and bit line (not shown).

Each of the second generators 110_1, 110_2, . . . , 110_N is connected to each of the banks 101_1, 101_2, . . . , 101_N. Each of the second generators 110_1, 110_2, . . . , 110_N respectively generates an active current IA1, IA2, . . . , IAn in response to a control signal (e.g., an active signal ACT) externally provided by a controller (not shown). Those of ordinary skill in the art will recognize that a broad range of devices may serve as a competent memory device controller, such as a Central Processing Unit (CPU), a memory controller, a master memory device, etc. Each of the resulting plurality of active signals ACT1, ACT2, . . . , ACTn may be used to maintain a respective one of the plurality of banks 101_1, 101_2, . . . , 101_N in an active state.

Thus, each of the active currents IA1, IA2, . . . , IAn generated by the plurality of second generators 110_1, 110_2, . . . , 110_N is applied to a corresponding one of the plurality of banks 101_1, 101_2, . . . , 101_N. Each of the banks 101_1, 101_2, . . . , 101_N is "activated" (i.e., placed in an active state) by the corresponding active current IA1, IA2, . . . , IAn. In certain embodiments of the inventive concept, each of the active currents IA1, IA2, . . . , IAn is provided to bit line(s) in a respective one of the banks 101_1, 101_2, . . . , 101_N. Thus, each of the bit lines may be controlled in such a manner that it is raised to an active voltage level by application of a corresponding active currents IA1, IA2, . . . , IAn.

As illustrated in FIG. 1, the first bank 101_1 of the banks 101_1, 101_2, . . . , 101_N is connected to a first second generator 110_1. The first second generator 110_1 generates a first active current IA1 in response to a first active signal ACT1 received from the processor, and provides the first active current IA1 to a first bank 101_1. The first bank 101_1 is activated by the first active current IA1 provided by the first second generator 110_1.

In the illustrated example of FIG. 1, the first active signal ACT1 is provided through the switching circuit 120 which will be described later in some additional detail. The first active signal ACT1 controls a switching operation for a first switch 120_1 connected to the first bank 101_1, wherein the first switch 120_1 is provided in a plurality of switches 120_1, 120_2, . . . , 120_N of the switching circuit 120.

The second bank 101_2 of the banks 101_1, 101_2, . . . , 101_N is connected to the $2^{nd}$ second generator 110_2 of the second generators 110_1, 110_2, . . . , 110_N and the N-th bank 101_N, where N is a natural number, is connected to the N-th second generator 110_N of the second generators 110_1, 110_2, . . . , 110_N.

The $2^{nd}$ second generator 110_2 generates a second active current IA2 in response to a second active signal ACT2 provided by the processor, and provides the generated second active current IA2 to the second bank 101_2 to activate the second bank 101_2. Similarly, the N-th second generator 110_N generates the N-th active current IAn in response to the N-th active signal ACTn externally provided by the processor, and provides the generated N-th active current IAn to the N-th bank 101_N to activate the N-th bank 101_N.

Also, the second active signal ACT2 and the N-th active signal ACTn are respectively connected to corresponding ones, that is, the second switch 120_2 and the N-th switch 120_N, of the switches 120_1, 120_2, . . . , 120_N of the switching circuit 120, and control the switching operations of the second switch 120_2 and the N-th switch 120_N.

Each one of the plurality of switches 120_1, 120_2, . . . , 120_N is thus connected to a corresponding one of the plurality of banks 101_1, 101_2, . . . , 101_N, and is controlled by a corresponding one of the plurality of active signals ACT1-ACTn provided by the processor.

Since the first switch 120_1 of the switching circuit 120 is connected to the first bank 101_1 with the first second generator 110_1, the first switch 120_1 is operated by the first active signal ACT1 externally input to the first second generator 110_1. When the first second generator 110_1 enabled by the first active signal ACT1 outputs the first active current IA1 to the first bank 101_1, the first switch 120_1 is turned OFF by the complementary operation with the first second generator 110_1, that is, by the first active signal ACT1. The first switch 120_1 that is turned OFF cuts off the connection between the first bank 101_1 and the first generator 130 that will be described later.

Likewise, the second switch 120_2 of the switching circuit 120 is connected to the second bank 101_2 with the $2^{nd}$ second generator 110_2 and receives the second active signal ACT2 externally input to the $2^{nd}$ second generator 110_2 to perform the opposite operation of the $2^{nd}$ second generator 110_2. The N-th switch 120_N of the switching circuit 120 is connected to the N-th bank 101_N with the N-th second generator 110_N and receives the N-th active signal ACTn externally input to the N-th second generator 110_N to perform the opposite operation of the N-th second generator 110_N.

That is, each of the switches 120_1, 120_2, . . . , 120_N may be controlled to be turn ON/OFF by each of the active signals ACT1, ACT2, . . . , ACTn that is externally input to each of the second generators 110_1, 110_2, . . . , 110_N. When each of the switches 120_1, 120_2, . . . , 120_N is controlled to be turned on by a corresponding one of the active signals ACT1, ACT2, . . . , ACTn, each of the second generators 110_1, 110_2, . . . , 110_N may be disabled by the corresponding one of the active signals ACT1, ACT2, . . . , ACTn.

When each of the switches 120_1, 120_2, . . . , 120_N is controlled to be turned OFF by each of the active signals ACT1, ACT2, . . . , ACTn, each of the second generators 110_1, 110_2, . . . , 110_N may be enabled by the corresponding one of the active signals ACT1, ACT2, . . . , ACTn. Also, each of the switches 120_1, 120_2, . . . , 120_N that is turned OFF by each of the active signals ACT1, ACT2, . . . , ACTn, may cut off the connection between the first generator 130 and each of the banks 101_1, 101_2, . . . , 101_N.

Each of the switches 120_1, 120_2, . . . , 120_N of the switching circuit 120 may be implemented by a MOS transistor or a transfer gate. In the embodiment illustrated in FIG. 1, the switches 120_1, 120_2, . . . , 120_N are formed using PMOS transistors.

Thus, the first generator 130 is connected to each of the banks 101_1, 101_2, . . . , 101_N via a corresponding switch provided by the switching circuit 120. The first generator 130 generates a standby current IS in response to a control signal externally provided, for example, a standby signal STB to maintain each of the banks 101_1, 101_2, . . . , 101_N in a standby state. The standby current IS may be provided to each of the banks 101_1, 101_2, . . . , 101_N via at least one turned-ON switch of the switches 120_1, 120_2, . . . , 120_N.

For example, the standby current IS may be provided to the bit line of each of the banks 101_1, 101_2, . . . , 101_N. Each bit line may be controlled to be raised or lowered to the standby voltage by the standby current IS. For example, each of the switches 120_1, 120_2, . . . , 120_N of the switching circuit 120 may be connected between the first generator 130 and each of the banks 101_1, 101_2, ..., 101_N. An output terminal of the first generator 130 may be commonly connected to each of the switches 120_1, 120_2, ..., 120_N.

The first generator 130 generates the standby current IS in response to the standby signal STB, and may output the standby current IS to at least one bank connected to at least one turned-ON switch of the switches 120_1, 120_2, ..., 120_N by the active signals ACT1, ACT2, ..., ACTn, via the at least one turned-ON switch.

Referring to FIGS. 1 and 2, the first generator 130 may include a switch 131 and a comparator 133. In the illustrated example, the switch 131 is connected to an external power VDD, such as power voltage, and performs a switching operation according to the output of comparator 133. For example, the external power VDD connected to the switch 131 may be in a range of between 1-2 V. Although in the illustrated embodiment a PMOS transistor is used as the switch 131, the switch 131 may be formed using an NMOS transistor, or some other type of switching element.

The comparator 133 compares a reference voltage Vref1 and each of a plurality of bank voltages BV1, BV2, ..., BVn provided via the switching circuit 120 and outputs a result of the comparison. The comparison result output from the comparator 133 is used to control the switching operation of the switch 131. For example, the comparator 133 may be connected to the switching circuit 120 and receive a bank voltage from the switching circuit 120, for example, a bank voltage detected from each bank. One side of each of the switches 120_1, 120_2, ..., 120_N of the switching circuit 120 may be connected to each of the banks 101_1, 101_2, ..., 101_N. The other side of each of the switches 120_1, 120_2, ..., 120_N may be commonly connected to the comparator 133.

The comparator 133 may receive a bank voltage, that is, the bank voltage BV1 of the first bank 101_1, the bank voltage BV2 of the second bank 101_2, or the bank voltage BVn of the N-th bank 101_N, from at least one turned-ON switch by the active signal of the switches 120_1, 120_2, ..., 120_N of the switching circuit 120. The comparator 133 compares the bank voltage transmitted via the switching circuit 120 and the reference voltage Vref1, for example, a standby reference voltage of the memory device 100 that is externally input, and outputs a result of the comparison. The comparison result output from the comparator 133 is used to control the switching operation of the switch 131.

The switch 131 may be turned ON according to the comparison result and provide the standby current IS provided by the external power VDD to the at least one turned-ON switch of the switching circuit 120. When the second active signal ACT2 through the N-th active signal ACTn are externally input to the switching circuit 120, for example, the other switches 120_2-120_N except form the first switch 120_1 may be turned OFF among the switches 120_1-120_N of the switching circuit 120.

The comparator 133 of the first generator 130 may receive the bank voltage BV1 of the first bank 101_1 via the first switch 120_1 that is turned ON, and compare the reference voltage Vref1 and the bank voltage BV1 of the first bank 101_1. When the bank voltage BV1 of the first bank 101_1 is less than the reference voltage Vref1 as a result of the comparison of the comparator 133, the comparator 133 may output a comparison result to turn ON the switch 131. The switch 131 is turned ON as the comparison result output from the comparator 133, and may output the standby current IS provided from the external power VDD to the first bank 101_1 via the turned-ON switch, that is, the first switch 120_1, which is turned ON, of the switching circuit 120. The first bank 101_1 may raise or lower the bit line to the standby voltage in response to the standby current IS provided through the first switch 120_1.

While the standby current IS is provided to the first bank 101_1 via the first switch 120_1, the other banks of the memory device 100, that is, each of the second bank 101_2 through the N-th bank 101_N, may receive active current through each of the second generators 110_2-110_N connected thereto.

For example, the second active signal ACT2 through the N-th active signal ACTn that are externally provided may enable the other generators except for the first second generator 110_1 connected to the first bank 101_1. Accordingly, the second bank 101_2 through the N-th bank 101_N may raise each bit line to the active voltage according to the second active current IA2 through the N-th active current IAn, respectively, generated by the $2^{nd}$ second generator 110_2 through the N-th second generator 110_N which are enabled.

Also, when the bank voltage BV1 of the first bank 101_1 is greater than the reference voltage Vref as a result of the comparison of the comparator 133, the comparator 133 outputs a result of comparison to turn OFF the switch 131. That is, in the memory device 100 of the present exemplary embodiment as illustrated in FIGS. 1 and 2, when the standby current IS is supplied to each of the banks 101_1, 101_2, ..., 101_N by using the first generator 130 that is singularly provided, the switching circuit 120 formed of the switches 120_1, 120_2, ..., 120_N may be included between each of the banks 101_1, 101_2, ..., 101_N and the first generator 130.

Accordingly, since the at least one of the banks 101_1, 101_2, ..., 101_N of the memory device 100, which is to be activated, is disconnected from the first generator 130 and the other banks by the control signal provided from the switching circuit 120, noise (e.g., overdriving noise or sensing noise) generated from the activated at least one bank is prevented from being applied to the other adjacent banks. Also, since the memory device 100 uses only single first generator 130, the overall layout area of the memory device 100 may be reduced. Furthermore, the power (or current) consumed by the memory device 100 in at least the standby mode is reduced.

Figure 3:
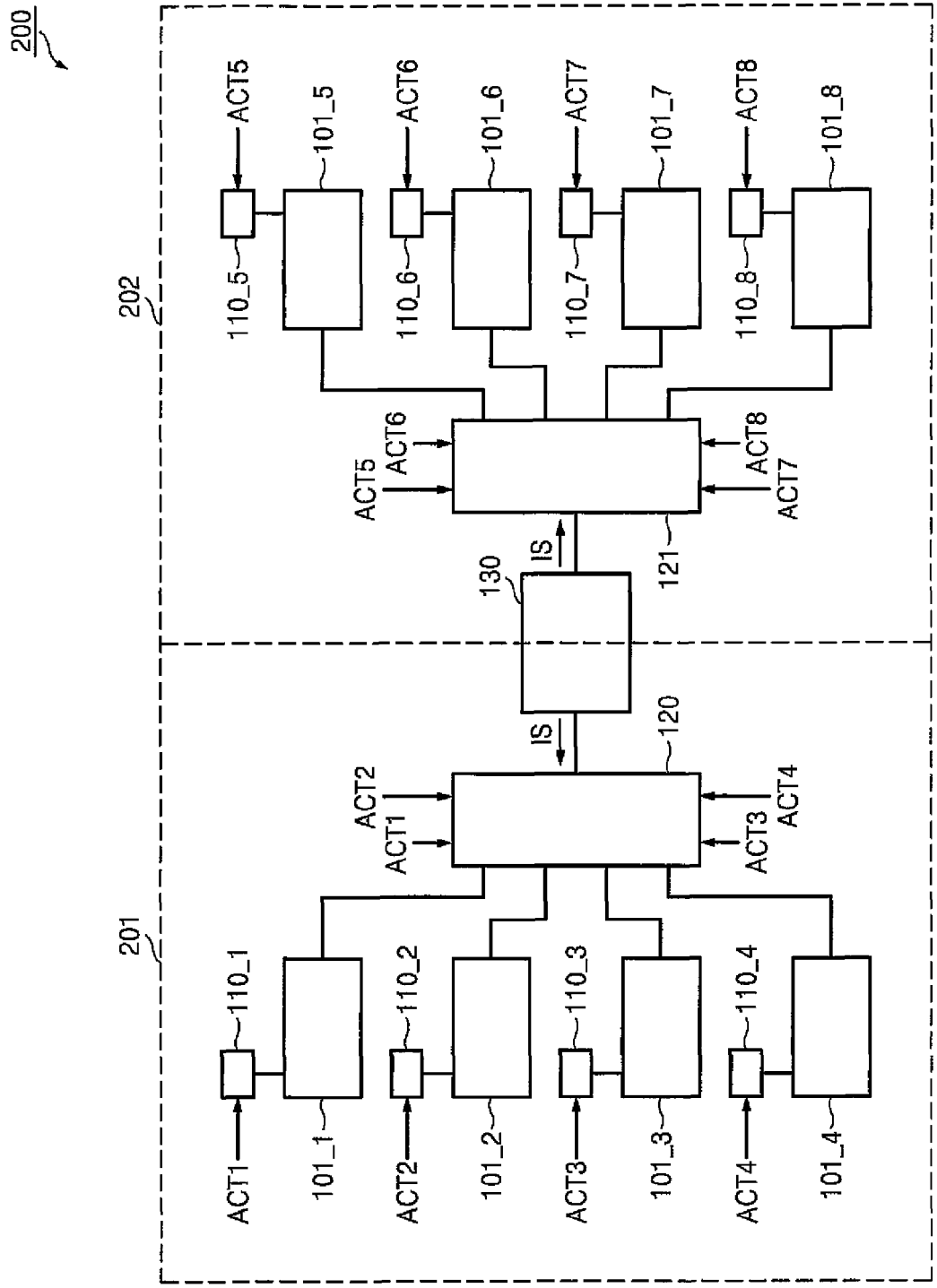
FIG. 3 is a schematic block diagram of a memory device according to another embodiment of the inventive concept.

FIG. 3 is a schematic block diagram of a memory device 200 according to another embodiment of the inventive concept. Referring to FIG. 3, the memory device 200 is substantially the same as the memory device 100 described above in relation to FIGS. 1 and 2, except for the following points.

Namely, the memory device 200 of FIG. 3 includes a plurality of channels, (e.g., a first channel 201 and a second channel 202). The first channel 201 includes four banks 101_1, 101_2, 101_3, and 101_4, four second generators 110_1, 110_2, 110_3, and 110_4, and one switching circuit 120. The second channel 202 includes four banks 101_5, 101_6, 101_7, and 101_8, four second generators 110_5, 110_6, 110_7, and 110_8, and one switching circuit 121. However, those skilled in the art will recognize that this arrangement of components is just one possible example, and that the inventive concept contemplates many different arrangements within its scope.

The switching circuit 120 of the first channel 201 and the switching circuit 121 of the second channel 202 share the first generator 130, which is singularly provided. As before, the switching operations are controlled by externally provided control signals, for example, first through eighth active signals ACT1, ACT2, ACT3, ACT4, ACT5, ACT6, ACT7, and ACT8. The standby current IS provided by the first generator 130 may be output to a corresponding bank, that is, at least one of the four banks 101_1, 101_2, 101_3, and 101_4 of the first channel 210 and the four banks 101_5, 101_6, 101_7, and 101_8 of the second channel 202.

For example, the switching circuit 120 of the first channel 201 may be switched by the active signals ACT1, ACT2, ACT3, and ACT4, and may output the standby current IS provided by the first generator 130 to at least one bank of the first channel 201. Also, the switching circuit 121 of the second channel 202 may be switched by the active signals ACT5, ACT6, ACT7, and ACT8, and may output the standby current IS provided by the first generator 130 to at least one bank of the second channel 202.

Although it is not illustrated in the drawings, each channel may further include a preliminary first generator (not shown). That is, since the memory device 200 according to another exemplary embodiment of FIG. 3 uses the single first generator 130 to supply the standby current to the banks of each of at least two channels, consumption power (or current) consumed by the memory device 200 when operated in the standby mode may be reduced, and its overall layout area may be reduced.

Thus, in the embodiment illustrated in FIG. 3, the memory device 200 includes eight banks and each bank consumes about 1 µA of standby current in the standby mode. In contrast, when a conventional generator arrangement is used to supply standby current, each bank typically consumed about 8 µA of standby current. So, embodiments of the inventive concept consume about ⅛ of the standby current consumed by similar conventional memory devices.

Figure 4:
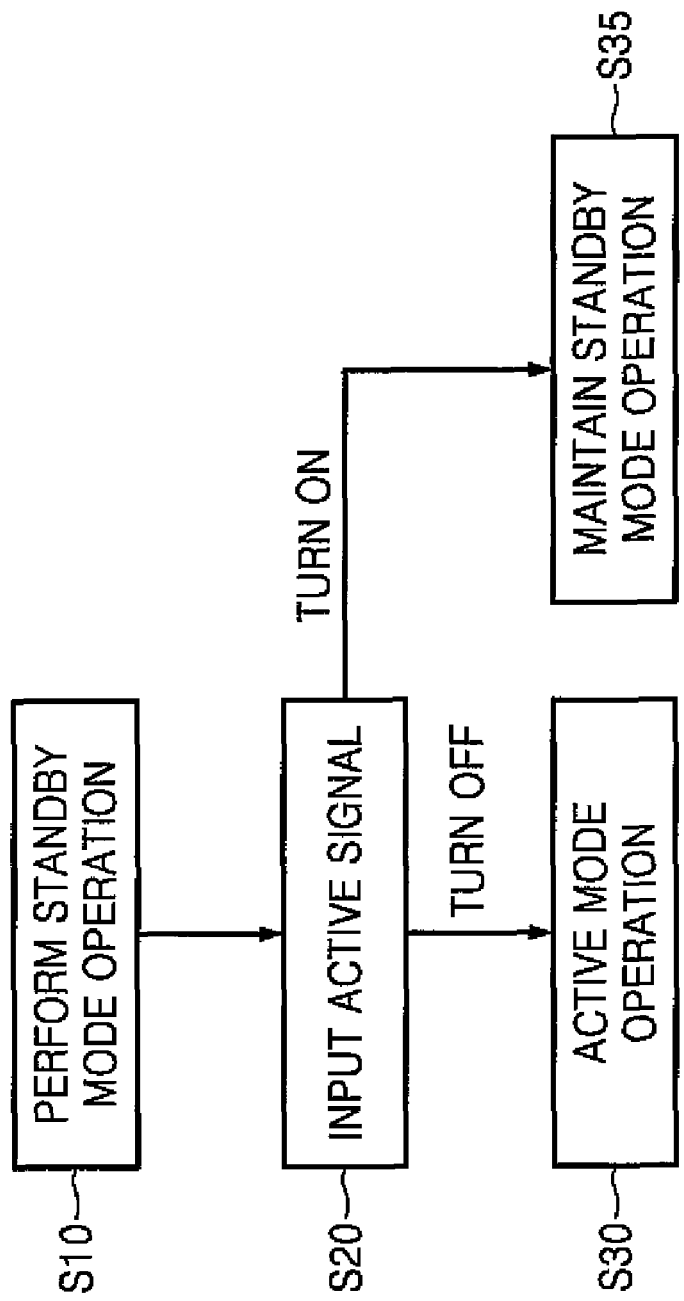
FIG. 4 is a flowchart summarizing the operation of the memory device of FIG. 1.

One possible method of operating the memory device described in relation to FIGS. 1 and 2 will now be described with reference to FIG. 4. FIG. 4 is a flowchart summarizing the operation of the memory device 100 of FIG. 1.

Referring to FIGS. 1, 2, and 4, the first generator 130 of the memory device 100 generates the standby current IS in response to the standby signal STB that is externally provided, and output the generated standby current IS to each of the banks 101_1, 101_2, . . . , 101_N via the switches 120_1, 120_2, . . . , 120_N. That is, the memory device 100 is operated in the standby mode (S10).

When an external active signal is input to the memory device 100 (S20), at least one of the banks 101_1, 101_2, . . . , 101_N of the memory device 100 may be operated in an active mode (S30). The other banks may maintain the standby mode operation (S35). For example, when the first active signal ACT 1 is externally input to the memory device 100, the first second generator 110_1 connected to the first bank 101_1 of the second generators 110_1, 110_2, . . . , 110_N of the memory device 100 may be enabled.

Also, the first switch 120_1, which is connected to the first bank 101_1, of the switches 120_1, 120_2, . . . , 120_N of the switching circuit 120 may be turned OFF by the first active signal ACT1. Accordingly, the first bank 101-1 of the memory device 100 may be disconnected from the first generator 130 and activated by receiving active current, that is, the first active current IA1, generated by the second generator 110_1 in response to the first active signal ACT 1.

The other banks, that is, the second bank 101_2 through the N-th bank 101_N, of the memory device 100 may maintain a standby mode operation by receiving the standby current IS from the first generator 130 by the turned-ON switch, that is, the second switch 120_2 through the N-th switch 120_N.

Figure 5:
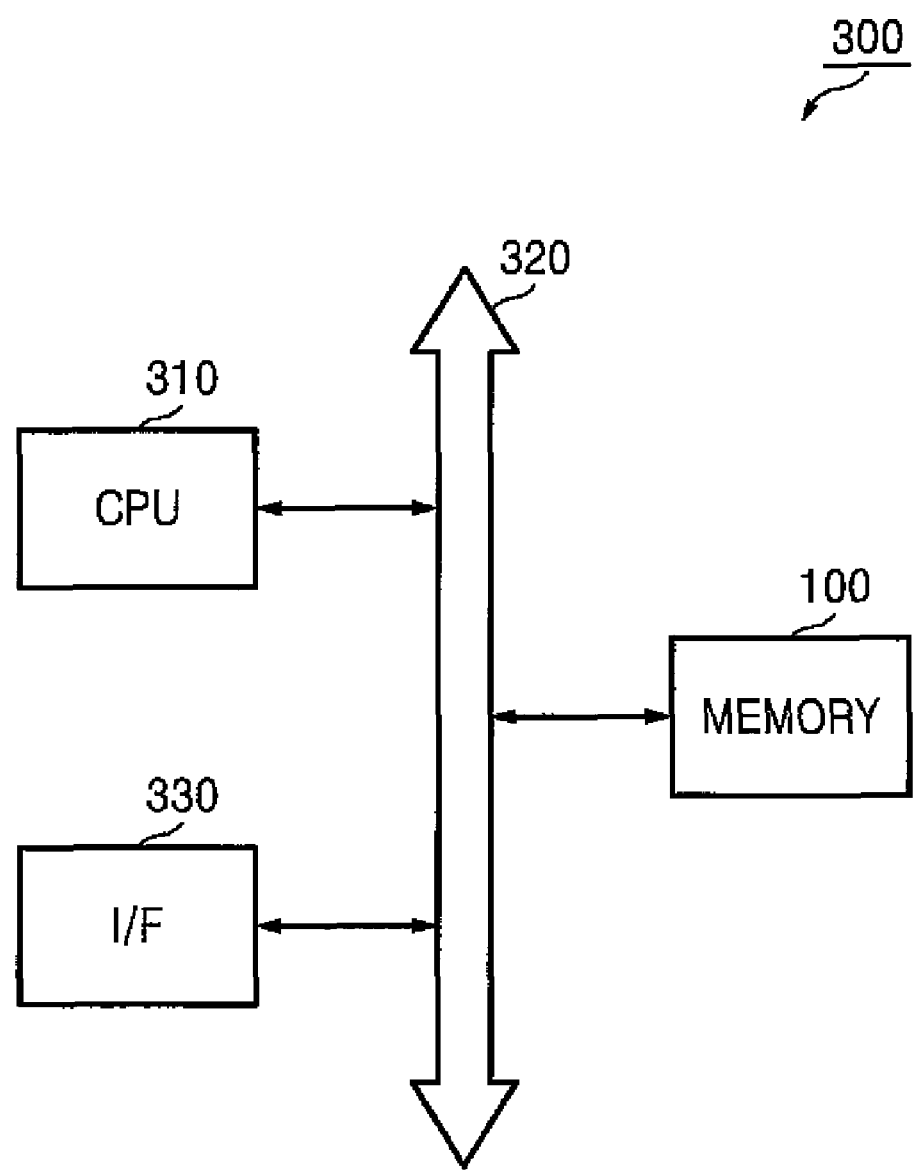
FIG. 5 is a schematic general block diagram of a memory system according a memory device according to an embodiment of the inventive concept.

FIG. 5 is a schematic block diagram of a memory system 300 according to an exemplary embodiment of the present inventive concept. Memory system 300 comprises, for example, a memory device such as the memory device 100 described in relation to FIGS. 1 and 2. Referring to FIG. 5, the memory system 300 also comprises a central processing unit (CPU) 310, a bus 320, an interface (I/F) 330.

Since the memory device 100 is substantially the same as that described with reference to FIGS. 1, 2, and 4, a detailed description thereof will be omitted herein. The CPU 310 may be used to generate and provide control signal(s) to control the operations of the memory device 100 and interface 330. For example, the CPU 310 may generate a standby signal to place the memory device 100 in standby and output the standby signal to the memory device 100 via the bus 320. Also, the CPU 310 may generate an active signal to activate the memory device 100 and output the active signal to the memory device 100 via the bus 320.

The memory device 100, as described above with reference to FIG. 1, may include the banks 101_1, 101_2, . . . , 101_N, the second generators 110_1, 110_2, . . . , 110_N, the switching circuit 120, and the first generator 130. The memory device 100 may be on standby or activated in response to the standby signal or active signal provided by the CPU 310 via the bus 320. The memory device 100 may be a DRAM.

The interface 330 may be an input/output interface, and transmit externally provided data to the memory device 100 or output the data stored in the memory device 100 to the outside, according to the control signal output by the CPU 310.

In the memory device according to the embodiments of the inventive concept and related memory systems, since a plurality of banks of the memory device are connected to a single standby current generation unit, consumption of standby current by the memory device may be reduced and its layout area may also be reduced.

Also, since a plurality of switches are provided between a plurality of banks and a single standby current generation unit and the switches are controlled to be operated complementarily with the banks, noise generated when one bank is activated may be prevented from being applied to the other banks.

While the inventive concept has been particularly shown and described with reference to exemplary embodiments thereof, it will be understood that various changes in form and details may be made therein without departing from the scope of the following claims.

What is claimed is:

1. A memory device comprising:
   a plurality of banks:
   a single first generator configured to generate a standby current in response to a standby signal; and
   a switching circuit configured to provide the standby current to a bank in the plurality of banks in response to a corresponding active signal,
   wherein the first generator comprises a comparator configured to compare a reference voltage and a bank voltage output from the bank via the switching circuit, and is further configured to output the standby current in response to a comparison result provided by the comparator.

2. The memory device of claim 1, wherein the first generator further comprises:
   a switch providing the standby current to the switching circuit according to the comparison result.

3. The memory device of claim 1, wherein the switching circuit comprises a plurality of switches, each being commonly connected between the first generator and a corresponding one of the plurality of banks, wherein each one of the plurality of switches is respectively switched in response to one of a plurality of active signals.

4. The memory device of claim 1, further comprising:
a plurality of second generators, each configured to provide an active current to a corresponding one of the plurality of banks in response to a corresponding one of a plurality of active signals.

5. The memory device of claim 4, wherein the switching circuit comprises a plurality of switches, each being commonly connected between the first generator and one of the plurality of banks, each of the plurality of switches being switched in response to one of the plurality of active signals, and each one of the plurality of second generators and a corresponding one of the plurality of switches being complementarily operated in response to a corresponding one of the plurality of active signals.

6. A memory device comprising:
a plurality of banks;
a single first generator configured to generate a standby current in response to a standby signal;
a plurality of second generators, each configured to provide an active current to a corresponding one of the plurality of banks in response to a corresponding one of a plurality of active signals; and
a plurality of switches, each being commonly connected between the first generator and each one of the plurality of banks and configured to provide the active current to a corresponding one of the plurality of banks in response to a corresponding one of the plurality of active signals,
wherein the first generator compares a reference voltage and a bank voltage output from at least one of the plurality of banks via the plurality of switches, and generates and outputs the standby current according to a result of the comparison.

7. The memory device of claim 6, wherein each of the plurality of second generators and each of the plurality of switches are complementarily operated in response to a corresponding one of the plurality of active signals.

8. The memory device of claim 6, wherein the first generator comprises:
a comparator configured to compare the bank voltage and the reference voltage and provide a comparison result; and
a switch providing the standby current to at least one of the plurality of switches in response to the comparison result.

9. A memory system comprising:
a central processing unit (CPU) configured to provide a control signal; and
a memory device configured to operate in response to the control signal,
wherein the memory device comprises
a plurality of banks,
a single first generator configured to generate a standby current in response to a standby signal, and
a switching circuit configured to provide the standby current to a bank in the plurality of banks in response to a corresponding active signal,
the first generator compares a reference voltage and a bank voltage output from the bank via the switching circuit, and generates and provides the standby current according to a result of the comparison.

10. The memory system of claim 9, wherein the first generator comprises:
a comparator comparing the bank voltage and the reference voltage and providing a comparison result; and
a switch providing the standby current to the switching circuit in response to the comparison result.

11. The memory system of claim 9, wherein the switching circuit comprises a plurality of switches, each being commonly connected between the first generator and each one of the plurality of banks, and each of the plurality of switches being configured to switch in response to a respective one of the plurality of active signals.

\* \* \* \* \*